United States Patent
McCormack et al.

(10) Patent No.: US 6,326,555 B1
(45) Date of Patent: Dec. 4, 2001

(54) METHOD AND STRUCTURE OF Z-CONNECTED LAMINATED SUBSTRATE FOR HIGH DENSITY ELECTRONIC PACKAGING

(75) Inventors: Mark Thomas McCormack; Hunt Hang Jiang, both of San Jose; Thomas J. Massingill, Scotts Valley; Solomon I. Beilin, San Carlos, all of CA (US)

(73) Assignee: Fujitsu Limited (JP)

( * ) Notice: Subject to any disclaimer, the term of this patent is extended or adjusted under 35 U.S.C. 154(b) by 0 days.

(21) Appl. No.: 09/259,126

(22) Filed: Feb. 26, 1999

(51) Int. Cl.$^7$ .................................................. H05K 1/03
(52) U.S. Cl. ............................. 174/255; 174/262; 29/831
(58) Field of Search ........................... 174/262, 263, 174/264, 265, 255; 361/792, 793, 794, 795; 29/831

(56) References Cited

U.S. PATENT DOCUMENTS

| | | |
|---|---|---|
| 3,915,729 | 10/1975 | Eustice . |
| 4,698,275 | 10/1987 | Holt . |
| 4,789,411 | 12/1988 | Eguchi et al. . |
| 4,859,268 | 8/1989 | Joseph et al. . |
| 4,928,387 | 5/1990 | Mather et al. . |
| 4,994,326 | 2/1991 | Shimmura et al. . |
| 5,046,238 | 9/1991 | Daigle et al. . |
| 5,062,896 | 11/1991 | Huang et al. . |
| 5,088,189 | 2/1992 | Brown . |
| 5,128,746 | 7/1992 | Pennisi et al. . |
| 5,272,007 | 12/1993 | Jenkinson et al. . |
| 5,328,522 | 7/1994 | Sowa et al. . |
| 5,376,403 | 12/1994 | Capote et al. . |
| 5,379,515 | 1/1995 | Kondo et al. . |
| 5,384,952 | 1/1995 | Matsui . |
| 5,401,913 | 3/1995 | Gerber et al. . |
| 5,406,459 | 4/1995 | Tsukamoto et al. . |
| 5,436,412 * | 7/1995 | Ahmad et al. ..................... 174/265 |
| 5,450,290 * | 9/1995 | Boyko et al. ..................... 361/792 |
| 5,491,301 * | 2/1996 | Akiba et al. ..................... 174/250 |
| 5,539,153 | 7/1996 | Schwiebert et al. . |
| 5,541,368 * | 7/1996 | Swamy ................................ 174/266 |
| 5,640,761 | 6/1997 | DiStefano et al. . |
| 5,744,285 | 4/1998 | Felten et al. . |
| 5,766,670 | 6/1998 | Arldt et al. . |
| 5,851,311 | 12/1998 | Diamant et al. . |
| 6,020,561 * | 2/2000 | Ishida et al. ..................... 174/261 |

OTHER PUBLICATIONS

M. Ishino, et al., "Development of Multilayer Wiring Board by Simultaneous Stacking Method of Tape Film," pp. 124–129, May 1998.

* cited by examiner

Primary Examiner—Jeffrey Gaffin
Assistant Examiner—Kamand Cuneo
(74) Attorney, Agent, or Firm—Coudert Brothers

(57) ABSTRACT

Structures, methods and materials for making multilayer circuit substrates are disclosed. The structures include bumped structures or microencapsulated conductive particles suitable for use in a lamination process to make a multilayer printed circuit substrate.

44 Claims, 6 Drawing Sheets

METHOD AND STRUCTURE OF Z-CONNECTED LAMINATED SUBSTRATE FOR HIGH DENSITY ELECTRONIC PACKAGING

FIELD OF THE INVENTION

The present invention relates to multi-layer circuit substrates, as well as structures, methods and materials for making the same. The multilayer circuit substrates can be used as, for example, a MCM (multichip module) substrate or a high density mother board.

BACKGROUND OF THE INVENTION

Multilayer circuit substrates are used to interconnect a large number of integrated circuit chips. Such substrates typically have a large number of signal lines between the chips as well as several layers of signal lines separated by interleaving dielectric layers. Via structures can electrically couple signal lines in different planes of the substrate. Because via structures can conduct electricity in a direction generally vertical to the planar direction of the substrate, they are sometimes called "z-connections". The signal lines and dielectric layers are typically made in a "build-up" process. In typical build-up process, conducting and dielectric layers may be formed sequentially by a variety of operations including metal deposition, photolithography, and etching. Build-up processes such as these involve many steps and are quite costly. Furthermore, a defect in the formation of one layer during the build-up process could potentially ruin the entire substrate. Current trends in the industry are toward increasing the density and decreasing the size of signal lines and via structures in the substrate. This, in turn, increases cost of the build-up process and increases the probability of defects.

Furthermore, current trends in the industry are also toward producing via structures having diameters less than about 200 μm. Reliable via structures in multilayer circuit substrates can sometimes be difficult to form for apertures less than about 200 μm in diameter, especially in a cost-effective manner. For example, via structures can be formed by depositing a slurry including a polymeric binder and conductive particles into an aperture in a dielectric layer. Conductive particles contact each other in the formed via structure and are bound by the binder which fills the interstices between the particles. The formed via structure can contact conductive pads disposed at opposite ends of the via structure, thus providing electrical communication between different planes in a substrate. One problem with this type of via structure is that the amount of conductive material which can be deposited in the aperture is dependent upon how efficiently the conductive particles are packed within the aperture. Conductivity relies on the contact between the particles, and the particles and mating pads or metallization on the aperture walls. The interstices between the conductive particles are filled with the binder which is non-conductive, thus limiting the conductivity of the via structure as a whole.

Accordingly, there is a need for reliable, efficient, and less expensive methods, materials, and structures for forming multilayer circuit substrates.

SUMMARY OF THE INVENTION

A first inventive concept relates to structures having conductive bumps and methods of forming and using these structures to make multilayer printed circuit substrates. The methods include: forming a laminate comprising a first circuitized layer having a first conductive region, a bonding sheet (preferably thermoplastic), and a release layer, wherein the bonding sheet is disposed between the first circuitized layer and the release layer; forming an aperture in the bonding sheet and the release layer to expose the first conductive region; depositing a conductive composition within the aperture; reflowing the conductive composition while the conductive composition is within the aperture to form a conductive bump; separating the release layer from the bonding sheet; and laminating a second circuitized layer having a second conductive region to the first circuitized layer so that the conductive region of the second circuitized layer is electrically coupled to the conductive bump.

A second inventive concept relates to a microencapsulating composition, microencapsulated particles, and methods for making multilayer printed circuit substrates using microencapsulating compositions and microencapsulated particles. The microencapsulating composition can be used in conjunction with any suitable stenciling process, and includes conductive particles and a carrier. The carrier includes a low viscosity resin, a fluxing agent, and a solvent. The microencapsulating composition can form a plurality of microencapsulated conductive particles, which are used to form a via structure in a multilayer printed circuit substrate.

Multilayer circuit substrates formed according to the first or second inventive concepts can be incorporated into any suitable electrical assembly. Exemplary assemblies include a chip modules such as multichip modules or single chip modules, as well as grid array packages such as ball grid arrays or pin grid arrays. In such electrical assemblies one or more chips can be disposed on the multilayer circuit substrate and can be in electrical communication with a via structure in the multilayer circuit substrate. The electrical assemblies can also include one or more multilayer ceramic circuit substrates or rigid polymeric wiring boards in any suitable combination or permutation with a flexible, rigid polymeric, or ceramic multilayer circuit substrate.

These and other aspects of the first and second inventive concepts will become apparent to those skilled in the art from the following detailed description, the accompanying drawings, and the appended claims. Aspects of the first and second inventive concepts can be used separately or together in any suitable manner.

DETAILED DESCRIPTION

Bumped Structures

Embodiments according to the first inventive concept can be described with reference to FIGS. 1 to 8. In the illustrated embodiment, a laminate, such as the laminate 20 shown in FIG. 2 can be formed. The laminate 20 shown in FIG. 2 includes a first circuitized layer 10 having one or more conductive regions 12(a), 12(b), 12(c); a bonding sheet 14 preferably made of a thermoplastic material; and a release layer 16 disposed on top of the bonding sheet 14.

Figure 1:
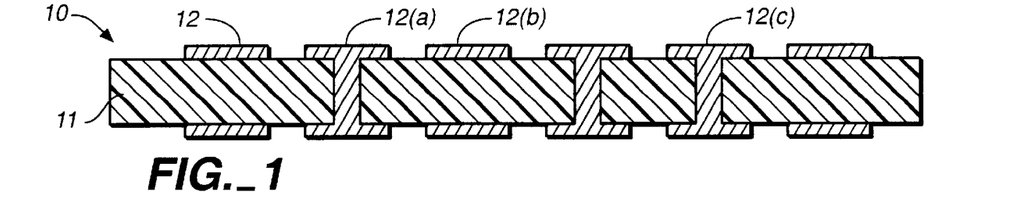
FIGS. 1 to 8 show cross sections of circuitized layers illustrating a method for making a multilayer printed circuit substrate using a conductive bump according to the first inventive concept.
Figure 2:
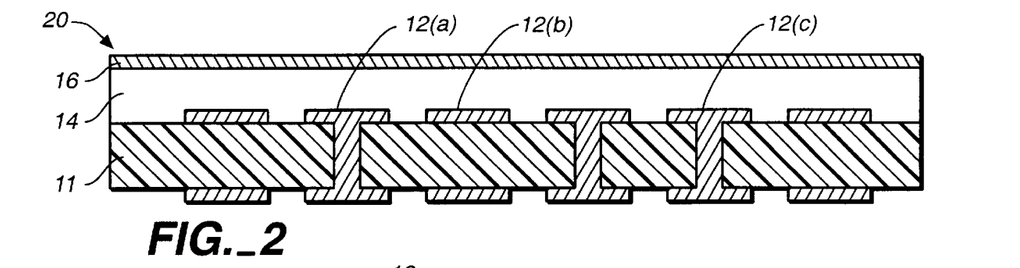

The first circuitized layer 10 has a dielectric layer 11 and a patterned metal layer 12 on the dielectric layer 11. The dielectric layer 11 can be flexible or rigid, and can have any suitable thickness. For example, the dielectric layer 11 can include a flexible polymeric film such as a polyimide film (e.g., KAPTON™ from DuPont, or UPILEX™ from Ube Industries, Ltd.) having a thickness between about 12.5 $\mu$m and about 200 $\mu$m. If the printed circuit substrate is rigid, the dielectric layer 11 can be formed of a rigid polymeric or ceramic material. In this case, the dielectric layer 11 preferably has a thickness of about 200 $\mu$m or more.

The patterned metal layer 12 can be formed on the dielectric layer 11 by any suitable method including conventional additive and subtractive methods. The patterned metal layer 12 can include a number of conductive regions 12(a), 12(b), 12(c). These conductive regions 12(a), 12(b), 12(c) are preferably conductive pads, which can contact one end of a subsequently formed via structure. The conductive regions 12(a), 12(b), 12(c) can be made of any suitable material including metals and metal alloys with which the via structure-forming material (e.g., a conductive slurry) can form a metallurgical bond. Preferably, the conductive regions include copper optionally coated with a solderable surface coating or finish. Preferably, the selection of the material of the conductive region and the conductive material forming the via structure are such that they do not promote the formation of severely intermetallic via structures (e.g., where a layer intermetallic material thicker than 5 $\mu$m is formed in the via structure).

The conductive regions can be in the form of a single layer or multiple layers. For example, one or more of the conductive regions 12(a), 12(b), 12(c) can include a layer of metal (e.g., Cu) coated with one or more layers of any suitable metallic material including brass, bronze, Zn, Ni, Sn, Cd, Bi, Au, In, Pd, Ag, solder, alloys, and combinations thereof. The metallic coating can serve as, for example, an adhesion layer or a diffusion barrier between a metal layer and a via structure. Any suitable method can be used to coat the layer of metal. For example, electroless, electrolytic, and immersion plating can be used to deposit a layer of metal on a conductive pad. Other suitable methods can include sputtering, evaporation, hot air solder leveling, dip coating, meniscus coating, wave soldering, or any other suitable method.

The bonding sheet 14 is preferably thermoplastic, and can have any suitable thickness including a thickness between about 12.5 $\mu$m and about 200 $\mu$m. The bonding sheet 14 may include any suitable material including polyimides, liquid crystal polymers, cyclo-olefins, polyurethanes, polyamides, benzocyclobutanes, polyamide-imides, polyarylene ether, benzimidazoles, polyetherketones, polysiloxanes, polyetheretherketones, polyphenylquinozalines, polyimide iso-indoloquinazolinediones, fluoropolymers, cyanate esters, bismaleimide triazine (BT), cynate ester, and combinations thereof.

The bonding sheet can include any suitable number of layers. For example, the bonding sheet can include a rigid or thermally stable flexible core coated with one or two adhesive layers. In some instances, composite bonding sheets can be used to provide the formed multilayer circuit substrates with favorable thermal expansion properties.

The laminate 20 shown in FIG. 2 can be formed in any suitable manner. For example, the bonding sheet 14 can be preformed before adhering to the first circuitized layer 10. In some embodiments, a preformed bonding sheet can be laminated to the first circuitized layer 10. Illustratively, composites comprising a bonding sheet sandwiched between two release layers are commercially available. One of the release layers can be separated from the bonding sheet thus exposing a bonding surface of the bonding sheet. The bonding sheet/release layer composite can be tack laminated to the first circuitized layer 10. During tack laminating, heat and pressure softens the resin in the bonding sheet, thus permitting the bonding sheet 14 to adhere to the first circuitized layer 10. Preferably, tack laminating is performed at low pressures (e.g., about 50 psi to about 150 psi) under vacuum. In an exemplary tack laminating process, a release layer and a bonding sheet (e.g., a DuPont Kapton™ KJ bonding sheet) composite can be tack laminated at about 240° C. for about 5 minutes and at a pressure of about 100 psi to the first circuitized layer with a Wabash VS75H-24 hydraulic vacuum press. When the composite having the release layer 16 and the bonding sheet 14 is laminated on the first circuitized layer 10, the release layer 16 can advantageously prevent the bonding sheet 14 from adhering to the dies of a lamination press or the rollers of a roll laminator. This is because the outer surface of the release layer 16 may be substantially non-adhesive. After tack laminating, the previously exposed bonding surface of the bonding sheet contacts the surface of the first circuitized layer and the unseparated release layer is on top of the bonding sheet, thus forming the laminate 20.

If desired, the release layer on top of the bonding sheet can be replaced with a different release layer. For example, the release layer on top of the bonding sheet can be peeled off and a different release layer can be placed on the bonding sheet in its place. Replacement of the release layer may be desirable if a release layer having different properties is desired. For example, it may be desirable to replace a release layer having a low melting point with a release layer having a higher melting point.

In some embodiments, it may be suitable to first laminate the release layer/bonding sheet composite to the first circuitized layer. After the bonding sheet firmly contacts and firmly adheres to the first circuitized layer, the release layer can be separated (e.g., by peeling) from the bonding sheet leaving an exposed bonding surface. A more desirable release layer can then be laminated on the exposed bonding surface of the bonding sheet to form the laminate 20.

In yet other embodiments, the preformed bonding sheet and the release layer can be laminated onto the first circuitized layer simultaneously. For example, a desired bonding sheet and a desired release layer can be placed on a first circuitized layer. This combination can then be laminated together by pressing the combination with heated platens or passing the combination through a pair of laminating rollers, thus forming the laminate 20.

The bonding sheet 14 can also be formed on the first circuitized layer in any suitable manner including screen printing, spray coating, or curtain coating a layer of liquid adhesive on the surface of the first circuitized layer 10. After the liquid adhesive layer is deposited on the first circuitized layer 10, the liquid adhesive layer can be soft baked to remove solvents therefrom. If a solvent is present in the liquid adhesive, soft baking increases the removal rate of the solvent from the liquid adhesive by vaporizing the solvent, thus causing it to separate from the liquid adhesive. The liquid adhesive layer can be heated to a temperature above room temperature (25° C.) for about one minute or more without significantly diminishing the adhesive properties of the material. Then, a release layer can be laminated to the bonding sheet as described above.

The release layer 16 may be formed on the bonding sheet 14, prior to or after the bonding sheet 14 formed is on the first circuitized layer 10 by any suitable method. For example, the release layer 16 can be formed on the bonding sheet 14 by vapor depositing a continuous or discontinuous layer of metallic or polymeric material on the bonding sheet 14.

In the laminate 20, the release layer 16 is releasably adhered to the bonding sheet 14. That is, the adhesive force between the bonding sheet 14 and the release layer 16 can be such that a person or machine can peel the release layer 16 from the bonding sheet 14 without significantly disrupting the physical disposition of the bonding sheet 14. The release layer 16 can include any suitable thickness, including a thickness of about 7.5 $\mu$m or more. In some embodiments, the release layer has a thickness between about 7.5 $\mu$m and about 100 $\mu$m, and preferably between about 12.5 $\mu$m and about 25 $\mu$m. The release layer can be made of any suitable material. The release layer 16 can include a metallic or a polymeric material which does not melt at the reflow temperature of the conductive particles used to form the via structure. The release layer 16 can have a melting point greater than about 250° C., or more preferably greater than about 350° C. or even greater than about 450° C. Preferably, the release layer is a thermally stable material such as polytetrafluoroethylene (Teflon™), polyimide, or a metallic film.

Figure 3:
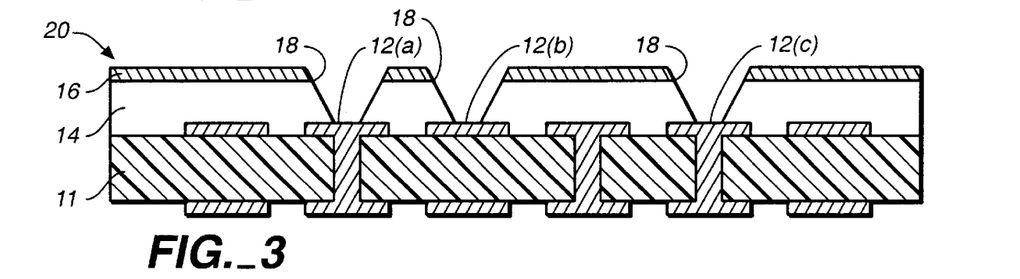

With reference to FIG. 3, after the laminate 20 is formed, one or more apertures are formed in the bonding sheet 14 and the release layer 16 to expose one or more conductive regions 12(a), 12(b), 12(c) on the first circuitized layer 10. Each aperture 18 can have a diameter of about 25 Am or more. For example, the formed apertures 18 may have diameters in the range of from about 25 $\mu$m to about 500 $\mu$m, preferably from about 50 $\mu$m to about 250 $\mu$m. Preferably, the minimum aperture diameter is about three times the maximum particle size of the conductive particles subsequently deposited in the apertures. For example, the minimum diameter for the apertures shown in FIG. 3 can be about 50 $\mu$m or more for conductive particles having maximum diameters of about 15 $\mu$m.

The apertures 18 can be formed by any suitable method. Preferably, the apertures 18 are formed by laser drilling. By doing so, the apertures formed in the bonding sheet 14 and release layer 16 are self-aligned with respect to each other and the conductive regions 12(a), 12(b), and 12(c) on the first circuitized layer 10. Any suitable laser can be used for this purpose. For example, a YAG-UV laser, Excimer laser, or $CO_2$ laser may be used to form the apertures 18. A YAG-UV laser is preferred because it provides a higher yield of defect-free drilled apertures, and because apertures formed with a YAG-UV laser typically do not need cleaning. Optionally, a lasing sheet can be placed on top of the release layer to facilitate the laser drilling operation. A lasing sheet promotes beneficial heat distribution for the laser drilling, thus providing more precise hole drilling. Suitable lasing sheets can be obtained from Mitsubishi Chemical, Inc.

In some embodiments, blind apertures are formed in at least three layers including the release layer 16, the bonding sheet 14, and the dielectric layer 10 by laser drilling these layers from the side having the release layer 16. The formed apertures expose conductive regions on the far side of the dielectric layer (i.e., relative to the position of the release layer). Specific details regarding this process are described in U.S. patent application Ser. No. 09/192,003, filed Nov. 13, 1998, which is incorporated by reference in its entirety for all purposes, and which is also assigned to the assignee of the present application.

The presence of the release layer 16 on the bonding sheet 14 protects the underlying bonding sheet's upper bonding surface from being contaminated with byproducts from the laser drilling process. Contaminants on the bonding surface of the bonding sheet can prevent the bonding sheet from adequately bonding to a desired surface. For example, ash products can be produced when the bonding sheet is laser drilled to form apertures. If the ash products deposit on the bonding surface of the bonding sheet, the ash products can be disposed between this surface and an adjacent surface to which the bonding sheet is to be bonded, consequently inhibiting bonding between these surfaces.

In an alternative embodiment, the apertures 18 can also be formed in the bonding sheet 14 and the release layer 16 by using dry or wet etch methods. For example, in some embodiments, a layer of resist can be deposited on release layer 16. The resist layer can then be patterned and developed to expose portions of the release layer which are above the conductive regions 12(a), 12(b), 12(c), on the first circuitized layer 10. Then, the exposed portions of the release layer 16 can be etched along with corresponding portions of the adjacent bonding sheet 14 to form apertures 18 which expose the conductive regions 12(a), 12(b), 12(c). In other embodiments, the release layer 16 and the bonding sheet 14 may be photosensitive so that both layers may be pattern exposed to radiation, and then developed to form plural apertures 18.

In the manufacture of printed circuit substrates, an alignment tolerance is provided for each aligning process to account for misalignment between patterns on the two layers being aligned (e.g., a bonding sheet and a first circuitized layer). As sets of layers are aligned in the production of a multilayer printed circuit substrate, the alignment tolerances constructively add. In designing a layer of circuitry for the substrate, the minimum spacing between vias and signals lines factors in the worst case cumulative misalignment which might occur during processing. Accordingly, the density of the signal lines and the vias in a circuit substrate are often dependent upon the accuracy of aligning procedures such as a stencil alignment procedure. Since embodiments of the first inventive concept do not require a stencil alignment step prior to depositing a conductive material, embodiments of the invention can provide for circuit substrates with dense circuitry. The formation of apertures in both the first circuit layer 10 and the bonding sheet 14 at essentially the same time (e.g., by laser drilling) provides nearly perfect alignment between the apertures in these layers, thus eliminating one set of alignment tolerances. This enables the produced multilayer printed circuit boards to have more closely spaced via structures and signal lines.

After forming the apertures 18, they can be cleaned to remove any unwanted residue therein. Any suitable cleaning method can be used, including a plasma cleaning operation or a wet cleaning process.

Figure 4:
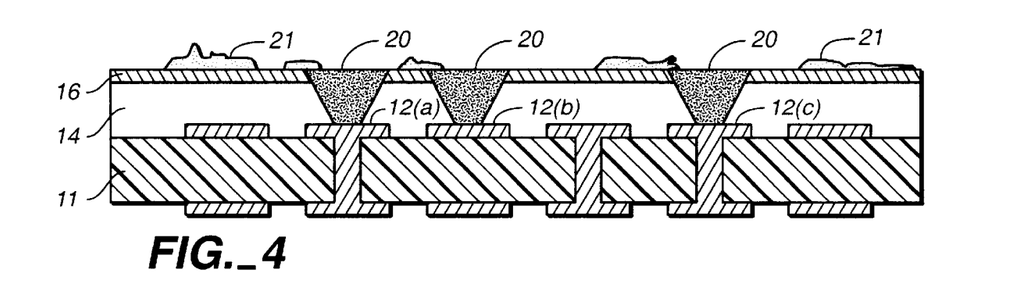

After the apertures 18 are formed in the bonding sheet 14 and the release layer 16 above the conductive regions 12(a), 12(b), 12(c) of the first circuitized layer 10, a conductive composition in the form of a conductive slurry can be deposited within the apertures 18 and on the conductive regions 12(a), 12(b), 12(c) while the release layer 16 is still in place. Any conductive composition suitable for forming a via structure can be deposited into the apertures. For example, suitable conductive compositions include a carrier having a fluxing agent, and conductive particles. The conductive particles can include those conductive particles which are used in the microencapsulating composition described below in the second inventive concept.

The slurry can be deposited within the apertures 18 by any suitable method including passing a doctor blade or squeegee over the surface of the release layer 16 with the slurry disposed along its leading edge. As the slurry passes across the surface of the release layer 16, some of the slurry 20 deposits into the apertures 18 while some of the slurry residue 21 may remain on the outer surface of the release layer 16. The apertured release layer 16 acts as a stencil, thus controlling the amount of slurry deposited within the apertures of the bonding sheet 14.

Using a release layer as a stencil to deposit a conductive slurry provides several benefits. First, the release layer 16 protects the bonding surface of the bonding sheet 14 during the deposition of the slurry, thus preventing the slurry from contaminating the bonding surface of the bonding sheet. Contaminants present on the bonding surface of the bonding sheet can prevent the bonding sheet from adequately adhering to an adjacent layer. Second, as stated previously, in conventional stenciling processes, there is the potential for misalignment of the stencil during processing. For this reason, the diameter of stencil apertures are normally smaller than the diameter of the apertures in which the conductive composition is deposited. However, in embodiments of the invention, the apertures in the release layer 16 are virtually perfectly aligned with, and have substantially the same diameter as, the underlying apertures in the bonding sheet 14. Therefore, the minimum diameter of the bonding sheet apertures are not limited by the dimensions of the release layer apertures as would be the case with a removable stencil. The use of a release layer therefore enables the formation of smaller diameter and more densely packed via structures. Third, the release layer 16 can be at least 12.5 Am thinner than the thinnest stencil currently available (25 μm). Thinner stencils can be used to deposit conductive material into smaller apertures, which can result in the formation of smaller via structures. Fourth, the release layer 16 conforms to any non-planarities on the surface of a bonding sheet caused by the unevenness of an underlying circuitized layer better than a conventional stencil. This reduces the variation in the amount of paste or conductive composition that is screened into a plurality of apertures 18. As a result, more uniform fig and better controllability are achieved with release layer 16, which are important factors for reliably forming high densities of small via structures. Fifth, conventional stencils are often used several times and tend to collect contaminants on their surfaces which can be later transferred to bonding sheet 14. As stated above, contaminants on the bonding surface of the bonding sheet 14 may prevent the tacky surface of the bonding sheet 14 from adhering to an adjacent surface.

Stenciling a conductive composition within the apertures of a dielectric layer (e.g., a bonding sheet) to form via structures also provides many advantages over methods such as electroplating and sputtering. For example, stenciling is considerably faster, less expensive, and easier to practice than methods such as sputtering and electroplating. In addition, methods such as sputtering and electroplating typically require additional etchback or planarization steps to remove excess material. Such steps are not required in embodiments of the invention. Furthermore, many desirable solder compositions which can be stenciled cannot be patterned by methods such as plating or evaporation. Moreover, when stenciling, a conductive slurry can be deposited into bonding sheet apertures having different sizes. Consequently, via structures having different sizes can be made in the bonding sheet, and in the formed multilayer circuit substrate. In comparison, it is difficult to reliably form via structures having different sizes with electroplating. For example, different-sized apertures in a bonding sheet respectively require different current densities to plate the apertures full, with conductive material to uniform heights. This cannot readily be achieved by means of an electroplating bath which has a relatively uniform current density throughout the bath.

Once the apertures 18 are filled with the conductive composition 20, the resulting structure can be optionally soft baked or heated to remove any air bubbles or solvent in the conductive composition 20. Removing air bubbles and solvent from the conductive composition prior to lamination can reduce the likelihood that they will remain in the formed via structure. Soft baking can occur at about 60° C. to about 120° C. for at least about 5 minutes, and preferably at about 80° C. to about 100° C. for about 15 to about 30 minutes.

Figure 5:
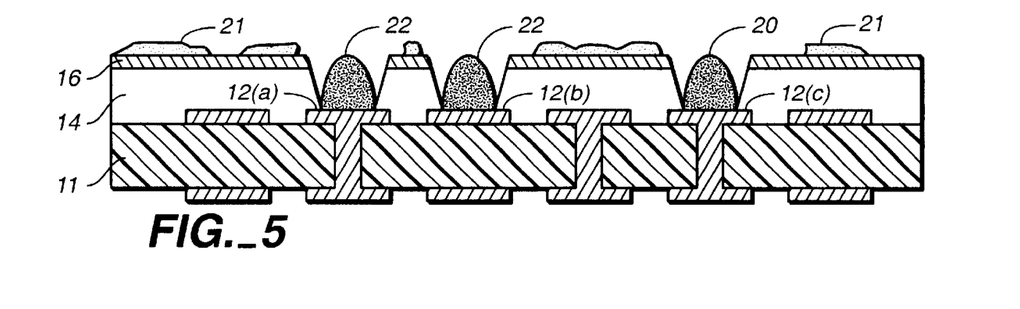

After depositing the conductive composition 20 in the apertures 18, the conductive composition 20 reflows to form plural conductive bumps 22. Upon reflow, the conductive particles in the conductive composition 20 melt and coalesce together and substantially eliminate the interstices previously present between the conductive particles. The surface tension of the coalescing metal particles in the conductive composition 20 causes coalescing particles to form conductive bumps.

After forming the conductive bumps 22, the conductive bumps 22 can be optionally fluxed or cleaned. The bumps 22 can be cleaned with a cleaning liquid such as water or isopropyl alcohol, and/or can be fluxed with any suitable fluxing material. Alternatively, a protective layer can be deposited or formed on the bumps by a process such as sputtering, evaporation, or PADS (plasma assisted dry soldering).

Figure 6:
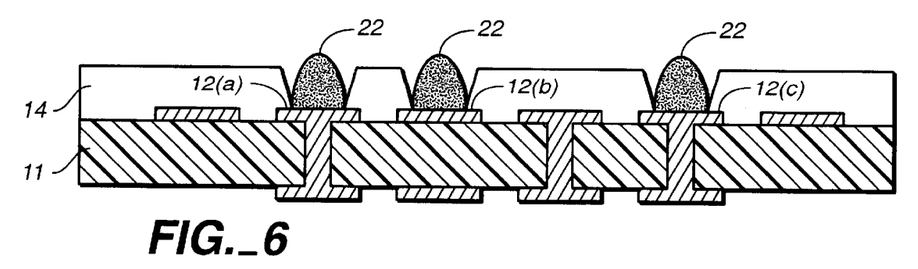

After forming the conductive bumps 22, the release layer 16 is separated from bonding sheet 14 by, e.g., peeling. Excess slurry or reflowed slurry 21 still remaining on the top surface of the release layer 16 can be easily removed from the resulting structure along with the release layer 16 by separating the release layer 16 from the bonding sheet 14. This exposes the upper surface of the bonding sheet 14, which is suitable for bonding to the second circuitized layer 10'.

Having an apertured release layer present on the bonding sheet during the reflow of the conductive composition provides a number of advantages. First, the presence of a release layer on the bonding surface of the bonding sheet prevents contaminants from contaminating the bonding surface of the bonding sheet during the reflow process. Secondly, the presence of the apertured release layer on the bonding sheet during the deposition of the conductive composition in the apertures and during reflow permits more conductive material to be incorporated into the formed via structure. For example, with reference to FIG. 4, the apertures of the release layer 16 confine an amount of slurry above the corresponding apertures in the underlying bonding sheet 14. This amount of slurry is substantially equal to the volume determined by the average cross-sectional area of the individual apertures in the release layer 16 times the thickness of the release layer 16. During reflow, the coalescing conductive particles melt and coalesce together to form a conductive body which displaces the liquid components of the slurry previously present between the interstices of the conductive particles. The formed conductive bump 22 can extend above the upper surface of the bonding sheet 14 and can preferably have substantially the same height as the upper surface of the release layer 16. Since the formed conductive bump 22 extends above the upper surface of the bonding sheet 14, good contact with an overlying conductive region on a circuitized layer laminated to the upper surface of the bonding sheet 14 is virtually assured. If the release layer 16 is not present on the bonding sheet during reflow, excess slurry above the aperture in the bonding sheet 14 may slump over and may contact an adjacent deposit of conductive composition, thus potentially creating a short circuit. Thirdly, the release layer 16 can serve to separate adjacent reflowing conductive composition deposits, thus decreasing the likelihood that adjacent deposits will join together during reflow, thus creating a short-circuit.

Figure 7:
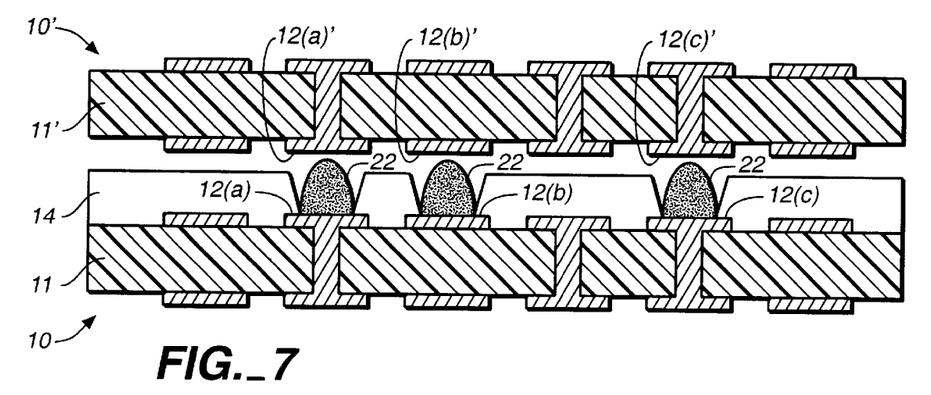

After the release layer 16 separates from the bonding sheet 14, the bonding sheet 14 and the first circuitized layer 10 are laminated to the second circuitized layer 10'. The second circuitized layer 10' may be the same or different than the above-described first circuitized layer 10. Preferably, the conductive regions 12(a)', 12(b)', 12(c)' on the second circuitized layer 10' include a substantially non-oxidizable metal such as a noble metal. Such metals need not be fluxed prior to contacting the conductive bumps 22.

Figure 8:
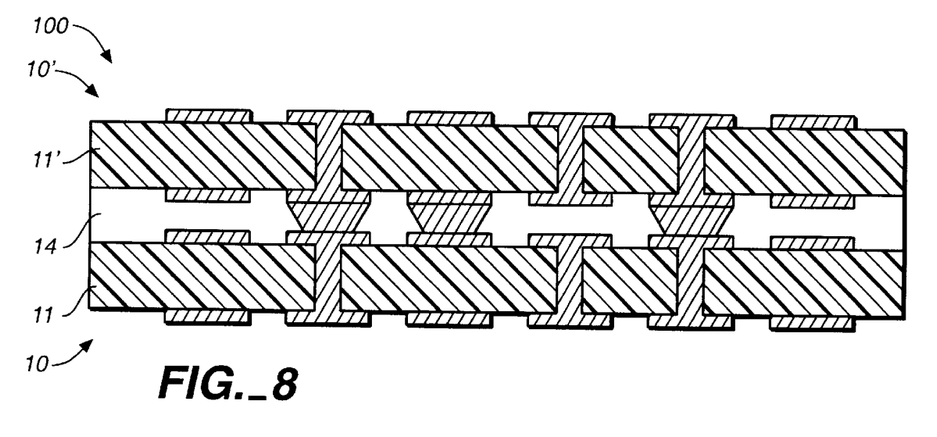

Any suitable lamination process can be used to laminate the second circuitized layer 10' to the bonding sheet 14. For example, the second circuitized layer 10' can be laminated to the bonding sheet 14 on the first circuitized layer 10 by applying heat and pressure to the combination under vacuum such that the conductive regions 12(a), 12(b), 12(c), on the first circuitized layer 10' and the conductive regions 12(a)', 12(b)', 12(c)' on the second circuitized layer 10' confront each other and contact opposite ends of the conductive bump 22. As heat and pressure are applied to the combination of the bonding sheet 14, the first circuitized layer 10, and the second circuitized layer 10', the ends of the conductive bumps 22 can melt and form bonding regions with the respective conductive regions on the first and second circuitized layers 10, 10'. The bonding regions can include intermetallic bonds which firmly bond the resulting via structures to their respective conductive regions. The lamination process forms a reliable multilayer circuit substrate 100.

Quite favorably, the via structures made according to embodiments of the first inventive concept can have resistances of less than about 20, 10, 5, and even 2 milli-ohms when the via structures have an average height between about 10 to about 100 microns, and an average diameter between about 50 to about 250 microns.

The multilayer printed circuit substrates made according to the first inventive concept have favorable electrical and mechanical properties. For example, test circuit substrates having a daisy-chain pattern were made according to an embodiment of the method of the first inventive concept. A daisy chain pattern consists of many lines and via structures, and can resemble a staircase geometry in a cross section of the test substrate. There were 115 lines with 218 via structures per line for a total of 25,070 via structures per daisy chain. The via structures were made from Au/20Sn solder particles were used to connect copper pads. Other test substrates used similar via structures, but had copper pads coated with electroless nickel and gold, with nickel serving as a diffusion barrier. The test substrates had via structures with diameters between 75 and 150 $\mu$m and heights between 25 and 50 $\mu$m, and average via resistances between 2.0 to 5.0 milli-ohms with standard deviations between 0.1 and 0.4 milli-ohms.

The formed test substrates were also highly reliable. After subjecting these test substrates to the tests in Table 1, the test substrates were not adversely affected by the tests (i.e., did not experience a resistance change exceeding 10%).

TABLE 1

| Stress Test | Conditions | Duration |
|---|---|---|
| reflow operation | 260° C. (peak) | 8 times |
| thermal cycling | −65° C. to +150° C. (using air with Si die attached) | 500 cycles |
| pressure cooker | 121° C., 15 psig | 168 hours |
| thermal aging | 150° C. | 1000 hours |
| bias testing | 20 V, 120° C., 85% relative humidity | 100 hours |

Furthermore, embodiments of the above-described methods can provide a multilayer printed circuit substrate with a via structure density between circuitized layers exceeding via structure densities within the circuitized layers. For example, with reference to the multilayer printed circuit substrate 100 shown in FIG. 8, the density of via structures within the bonding sheet layer 14 can be greater than the density of via structures present in the dielectric layers 11, 11' in the first and second circuitized layers 10, 10'. This can be especially true if the via structures in the dielectric layers 11, 11' are drilled through-holes (which are typically greater than about 250 $\mu$m) coated or filled with a metal. Since the via structures in the bonding sheet 14 can be much smaller (e.g., less than 200 $\mu$m) than via structures made by drilling, internal layers within the multilayer printed circuit substrate in embodiments of the first inventive concept can have higher via structure densities than the external layers. Advantageously, in embodiments of the first inventive concept, there are no large drilled through-holes within the bonding sheet layer to block internal electrical routings which can adversely affect circuit design.

Microencapsulating Conductive Compositions

A second inventive concept relates to a microencapsulating composition and microencapsulated particles for making structures such as via structures. The microencapsulating composition can be used with any suitable stenciling process including the above-described method of the first inventive concept. The microencapsulating composition can form a plurality of microencapsulated conductive particles, which can be used to form a via structure.

The microencapsulating composition can include conductive particles in an amount of at least about 75 wt. % based on the weight of the microencapsulating composition. At least about 50% by weight of the conductive particles can have melting points of less than about 400° C. The microencapsulating composition may also include a carrier including an epoxy-functional resin. The epoxy functional resin can have a viscosity of less than about 1000 centipoise at 25° C., preferably less than about 600 centipoise at 25° C. The carrier can also include a fluxing agent, preferably in an amount of at least about 0.1 wt % based on the weight of the carrier. In addition, the microencapsulating composition includes a solvent in an amount of at least about 5% by weight of the carrier, preferably between about 40% and 60% by weight of the carrier.

Any suitable weight proportion of conductive particles can be used in the microencapsulating composition. The microencapsulating composition can include greater than about 75% by weight conductive particles (based on the weight of the microencapsulating composition). Preferably, the microencapsulating composition includes between about 80 wt. % to about 95 wt. % conductive particles (based on the weight of the microencapsulating composition). The balance of the microencapsulating composition may be the carrier.

At least 50% by weight of the conductive particles in the microencapsulating composition can include melting points of less than about 400° C. For example, substantially all of the conductive particles in the microencapsulating composition can have melting points of less than about 400° C. Preferably, the conductive particles in the microencapsulating composition can include at least about 75% by weight, even more preferably greater than about 90% by weight, conductive particles having melting points less than about 400° C. In some embodiments, at least 50% by weight of the conductive particles in the microencapsulating composition can have melting points of less than about 260° C., and even less than about 200° C. If desired, the balance of the conductive particles of the microencapsulating composition can include conductive particles having melting points of greater than about 400° C.

The conductive particles in the microencapsulating composition, and in particular the conductive particles having melting points of less than about 400° C., may include pure metals, metal alloys, metal alloy precursors, metallic compounds, and combinations thereof. For example, the conductive particles can include one or more materials selected from the group consisting of In, Sn, Bi, Sb, Pb, Ni, Zn, Cu, Cd, Pt, Pd, Au and Ag.

Preferably, the conductive particles in the microencapsulating composition include soft materials such as solder particles. These materials can readily deform when pressed, thus providing for good areal contact between the conductive particles, as well as to other conducting surfaces. For instance, deforming the conductive particles against a conductive surface can increase the contact area with the land. Suitable examples of solder compositions can include metals, or single or multi-phase alloys having any suitable proportions of metallic atoms. The alloys can be binary, ternary, or other higher order compositions. Examples of binary alloys include In—Sn, Bi—Sn, In—Ag, Sn—Sb, Au—Sn, and Pb—Sn. Examples of ternary alloys include Pb—Sb—Sn alloys such as those containing approximately 10% Sb and 5–20% Sn (by weight % of the alloy). More specific examples of solders include 52In/48Sn, 58Bi/42Sn, 97In/3Ag, In, 37Pb/63Sn, 96.5Sn/3.5Ag, 95Sn/5Sb, 80Au/20Sn, and 90Pb/10Sn (described in terms of weight percentages).

The conductive particles can have any size or geometry suitable for use in a microencapsulating composition. The particles may have a size less than about 50 microns. Preferably, the particles have a size in the range from about 5 microns to about 25 microns. The conductive particles also can have any suitable shape. For example, the conductive particles can include one or more of the following particle shapes: spherical, irregular, plate-shaped and dendritic. Preferably, the conductive particles comprise generally spherical shapes.

The carrier can have thermosetting properties, and can constitute a major portion of the liquid portion of the microencapsulating composition, preferably the entire liquid portion of the microencapsulating composition. Also, the carrier can include any suitable combination of components including a resin, fluxing agents, solvents and curing agents. Additional materials may be added to the carrier or microencapsulating composition. For example, inhibitors and surfactants can be added to the carrier.

Furthermore, the carrier can be non-tacky when the carrier has not undergone thermal treatment, but becomes tacky when thermally treated (e.g., when thermal curing commences). The microencapsulating composition can be deposited into the apertures of the bonding sheet by depositing the microencapsulating composition through a stencil having apertures aligned with the apertures in the dielectric layer. The stencil can be an apertured flexible release layer, but may also be a rigid stencil. After the microencapsulating composition is deposited through the apertures of the stencil, the stencil can be removed, or can remain on the dielectric layer, leaving the microencapsulating composition disposed in the vias of the dielectric layer. Because the carrier in the microencapsulating composition remains non-tacky during this deposition procedure (i.e., before the composition is cured), the microencapsulating composition does not adhere to the stencil when it is deposited into the apertures of the dielectric layer. Consequently, the amount of microencapsulating composition deposited into the apertures of the dielectric layer can be maximized.

The carrier can include a resin in any suitable proportion. For example, the resin can be in an amount of at least about 20% by weight of the carrier, preferably between about 30% to about 75% by weight of the carrier. Suitable resins can include molecules (e.g, compounds, polymers, oligomers) with epoxy functionality. In such resins, the weight of the resin per epoxide can be greater than about 300, 400, or 500. Preferably, the epoxy functional resin includes a weight per epoxide greater than about 500. More preferably, the epoxy functional resin preferably has a weight per epoxide between about 550 to about 660. Also, the resin can include an epoxy-functional molecule having a molecular weight (e.g., a weight average molecular weight) greater than about 1000, preferably between about 2000 and about 3000. The epoxy-functional resin can include epoxy functional molecules alone or in combination with other non-epoxy functional molecules.

The resin can be derived from a natural substance such as a natural resin or a natural oil. Fatty acids and derivatives (e.g., a glyceride) thereof, especially epoxy-functional derivatives of fatty acids (e.g., a glyceride of ricinoleic acid), can be included in the resin. Many fatty acids have high molecular weights, but have a low degree of functionality. Preferred epoxy-functional resins can be derived from oils such as castor oil. Specific examples of such epoxy functional resins can include some Heloxy® series resins commercially available from Shell Corporation including Heloxy® 505.

The resin preferably has a low viscosity. For example, the resin can have a viscosity of less than about 1000 centipoise at 25° C., preferably less than about 600 centipoise at 25° C. The viscosity of the resin is more preferably between about 300 to about 500 centipoise at 25° C. The resin and carrier as a whole can have a viscosity of less than about 50 centipoise (preferably less than about 10 centipoise) for a time greater than about 1 minute when heated at or above the predominant melting temperature (e.g., between 200–290° C.) of the conductive particles in the microencapsulating composition. The "predominant melting temperature" of the conductive particles in the microencapsulating composition can be the melting temperature at which a majority of the conductive particles in the microencapsulating composition melt.

Advantageously, the low viscosity resin in the subsequently formed coating can be rapidly displaced by coalescing metal particles when it is processed (e.g., heated, compressed) in an aperture with non-wettable walls. The displacement of the resin can permit greater contact and wetting between the conductive particles in the inicroencapsulating composition.

The fluxing agent can include any material suitable for removing oxides from conducting surfaces such as pads and particles. However, the fluxing agent preferably comprises an organic acid. Organic acids are preferred because they can have relatively high boiling points. Exemplary fluxing agents can include cinnamic acid, succinic acid, gluteric acid, adipic acid, pimelic acid, suberic acid, azelaic acid, adipic acid, sebacic acid, precursors and combinations thereof. Preferably, the fluxing agent comprises at least one of cinnamic acid, adipic acid or another acid which functions in a chemically similar manner or has a chemically similar structure. Moreover, the fluxing agent can be in the carrier in any suitable percentage, but can preferably constitute from about 0.1 to about 25 weight percent of the carrier.

In some embodiments, the fluxing agent is optionally capable of curing the resin after the fluxing and the melting of the conductive particles in the microencapsulating composition has commenced. In other words, the fluxing agent can remove oxides from the conductive particles in the microencapsulating composition and then contribute to the curing of the carrier resin, particularly at higher process temperatures (e.g., greater than about 200° C., preferably greater than about 250° C.). Since the fluxing agent in these embodiments can chemically link molecules in the resin, the fluxing agent can be incorporated into the cured resin by providing chemical linkages to the molecules in the resin. This can significantly reduce the amount of flux which is free to participate in undesirable chemical reactions, such as corrosion which may occur after the connection is made or is in service. Furthermore, the presence of unused flux in an unbound form can produce undesired surface conduction, which could induce short circuiting between separated conducting regions in a multilayer circuit substrate.

Moreover, a process using such fluxing agents can be less complicated, because fewer starting materials are needed. For example, in some embodiments, the use of a separate curing agent or hardener is not needed, thus reducing the number of components used in the microencapsulating composition. In these embodiments, the microencapsulating composition can include a greater proportion of fluxing agent than is used conventionally. Since the fluxing agent may act as a curing agent, the amount of fluxing agent can be increased, thus dispensing with the need to use additional curing agents to cure the resin. For instance, in some embodiments, additional curing agents need not be used if the fluxing agent is greater than about 15 or greater than about 20 weight percent of the carrier.

Preferred embodiments of the second inventive concept do not include a hardener in the carrier. However, if desired, the carrier can also include hardeners to aid the curing of the resin. Hardeners can be added to the full equivalent weight (i.e., the amount of hardener to fully cure the resin) of the epoxy functional resin. For example, the amount of hardener added can be such that substantially all of the hardener will react with substantially all of the epoxy groups in the epoxy functional resin. If used, the hardener or curing agent can be added to the carrier in an amount less than about 30 wt. % of the carrier. Suitable curing agents or hardeners can include anhydrides such as methyltetrahydrophthalic anhydride (MTHPA), nadic methyl anhydride (NMA), and dodecyl succinic anhydride (DDSA). MTHPA is preferred, because MTHPA can advantageously increase the carrier curing time, thus permitting the conductive particles to melt and coalesce into a network more effectively and reliably. It is also preferred that the optional hardener have no hydroxyl groups, because hardeners without hydroxyl groups can advantageously increase the carrier gelling time.

The carrier also includes a solvent. The solvent is substantially non-reactive with, or inert to, the epoxy-functional resin to decrease the likelihood that the carrier in the microencapsulating composition may prematurely solidify. Premature solidification of the carrier, and especially the resin in the carrier, can prevent the conductive particles from subsequently coalescing together. In this regard, the solvent molecules can be substantially free of reactive functional groups such as hydroxyl groups and amines. Also, the solvent is preferably nonpolar or substantially nonpolar. In addition, the solvent is preferably volatile, and is preferably easily vaporized when heating above room temperature. Suitable examples of solvents include non-polar solvents such as mesitylene, hexane, toluene, and benzene, as well as ether acetates such as di(polypropylene glycol) methyl ether acetate. The solvent can be present in an amount of at least about 5% by weight of the carrier, preferably between about 20% and 80% by weight of the carrier.

The use of a solvent in the microencapsulating composition is advantageous. First, the use of a solvent in the carrier can help decrease the viscosity of the carrier thus permitting the carrier to be more easily screen printed or stenciled. Second, since the solvent is vaporized prior to the lamination of the second circuitized layer to the first circuitized layer, the volume of non-conductive components in the formed via structure can be reduced. The elimination of non-conductive material in the apertures during processing reduces the likelihood that the non-conductive material will interfere with the subsequent coalescing of the conductive particles, and will remain within a body of coalesced conductive particles in the formed via structure. Third, the use of a solvent in the microencapsulating composition can uniformly distribute components such as the fluxing agent throughout the carrier providing uniform properties to the formed coating material on the conductive particles. Fourth, the use of a solvent in the microencapsulating composition helps promote the formation of microencapsulated conductive particles. The advantages of using microencapsulated conductive particles to form via structures are described in further detail below.

Once the carrier and the conductive particles are selected, the carrier and the conductive particles can be mixed together by any suitable operation and with any suitable apparatus to impart uniformity to the microencapsulating composition. For example, the conductive particles and the carrier can be mixed together by mechanically mixing the microencapsulating composition in an apparatus such as a stirrer or blender. The mixing of the components of the microencapsulating composition can be performed while the components are heated.

After the microencapsulating composition is formed, the microencapsulating composition can be heated. Heating can evaporate the solvent in the microencapsulating composition, leaving the conductive particles encapsulated in a coating. The heating can take place under vacuum or in atmospheric conditions. The microencapsulating composition can be heated for 3 minutes or more at a temperature of about 80° C. or more, or preferably between about 80° C. and about 120° C. for about 10 to about 30 minutes to form microencapsulated conductive particles.

Figure 14:
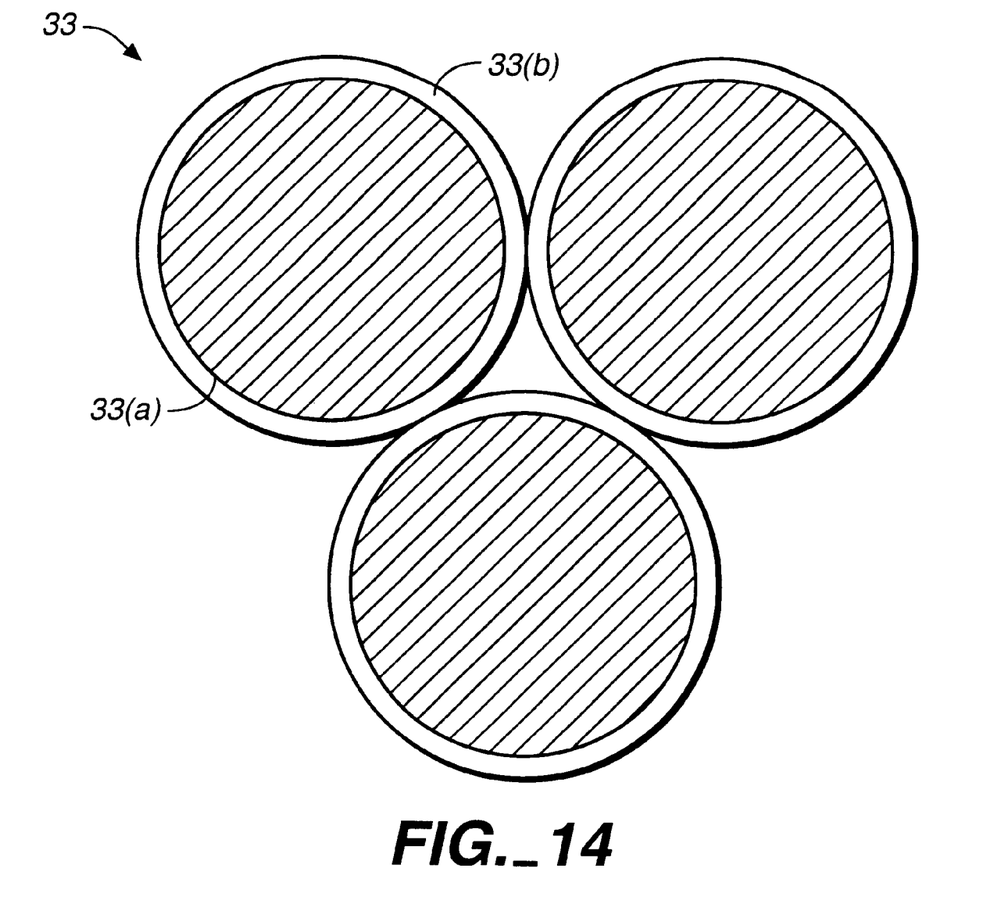
FIG. 14 shows cross sections of microencapsulated metallic particles.

As shown in FIG. 14, a plurality of microencapsulated conductive particles 33 can be formed. Each microencapsulated conductive particle can include a conductive particle 33(a) and a coating 33(b). The coating 33(b) can be substantially uniformly thick and can have a thickness less than about 5 microns, and preferably between about 1 and about 5 μm. In a plurality of the microencapsulated particles, the average coating thickness may be less than about 5 μm, preferably between about 1 and about 5 μm. The coating can include a coating material having a substantially solvent-free carrier material. Preferably, the coating material is a substantially uncured thermoset resin composition including the components of the microencapsulating composition without the solvent. After the microencapsulated conductive particles are formed, a number of interstices are present between adjacent microencapsulated particles.

Preferably, the time to substantially fully cure the coating material on the conductive particles is relatively long. For example, the coating material can form a stable gel after a time greater than about 10, 20, 30, and even 40 minutes, after the coating material is heated to the melting temperature of the conductive particle encapsulated by the coating. The coating gelling time can also be increased by increasing the equivalent weight of the resin used in the microencapsulating composition. By increasing the gelling time of the coating, the conductive particles can melt and flow into a cohesive body before the gelled coating inhibits contact between the melting conductive particles. As the conductive particles fuse and form a cohesive body, the coating material previously present on the particles can be displaced by the fusing conductive particles. The displaced coating material can be disposed around the cohesive body of formed conductive particles. Further, the displaced coating material can gel and then further solidify in response to increased heating and/or the action of a curing agent or hardener in the displaced coating material.

A preferred method of using the microencapsulating composition to form a via structure can be described with reference to FIGS. 9 to 13. The first and second circuitized layers 30, 30' shown in FIGS. 9 to 13 can have any of the characteristics of the first and second circuitized layers 10, 10' previously described and shown in FIGS. 1 to 8.

Figure 9:
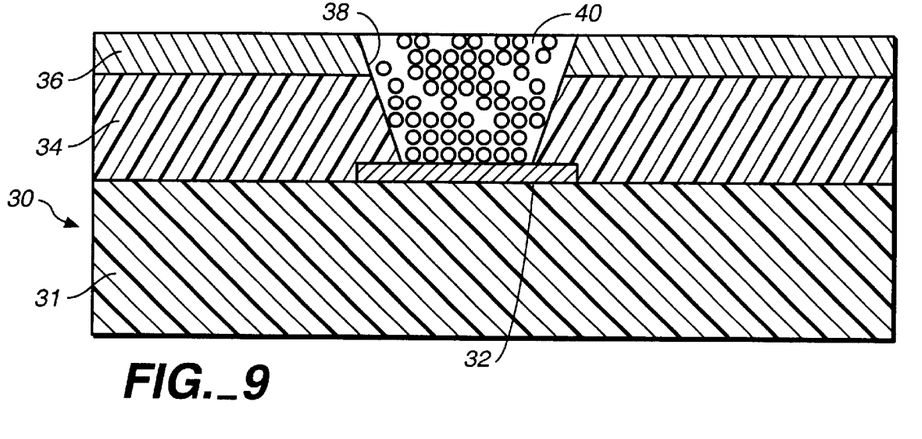
FIGS. 9 to 13 show cross-sections of circuitized layers illustrating a process of making a printed circuit substrate using microencapsulated conductive particles according to the second inventive concept.

FIG. 9 shows a first circuitized layer 30 with a dielectric layer 31 and a first conductive region 32. An intermediate dielectric layer 34 and a stencil 36 are disposed on the first circuitized layer 30 and have a common aperture 38. The aperture is filled with the microencapsulating composition 40 so that the microencapsulating composition 40 is disposed on the first conductive region 32. The stencil 36 can be of any suitable construction, but is preferably a release layer of the type previously described. Any suitable stenciling process can be used to deposit the microencapsulating composition 40 within the aperture, including the stenciling processes described in the above for the first inventive concept. As mentioned previously, when using stenciling a conductive composition into the apertures of a bonding sheet, via structures having different sizes can be produced.

The intermediate dielectric layer 34 may include a bonding sheet similar to those described for use in the above-described first inventive concept. Also, the intermediate dielectric layer 34 may include a filled or unfilled thermosetting bonding sheet. A typical filled resin sheet comprises a mixture of an uncured resin and filer material which is formed into a sheet (e.g., by extrusion). The uncured resin may be capable of being partially cured to its B-stage (a so called "B-stageable" resin). A pre-impregnated ("prepreg") bonding sheet can include a woven or nonwoven base sheet which has its surfaces coated with an uncured resin. Aramid fiber reinforced prepreg sheets and liquid crystal polymer (LCP) fiber reinforced prepregs are also desirable bonding sheets since they are especially adaptable to laser-drilling processes. Exemplary bonding sheets include: Nippon Steel polyimide bonding sheet SPB-A, and Shin-etsu epoxy bonding sheets types E31 through E38.

Preferably, the stencil 36 shown in FIG. 9 remains on the intermediate dielectric layer 34 while the microencapsulating composition 40 is heated to remove the solvent therefrom. However, if desired, the stencil 36 may be removed during the solvent removal process. The conductive composition 40 can be heated to any suitable temperature (or not at all) to vaporize the solvent, including a temperature of about 80° C. or more.

Figure 10:
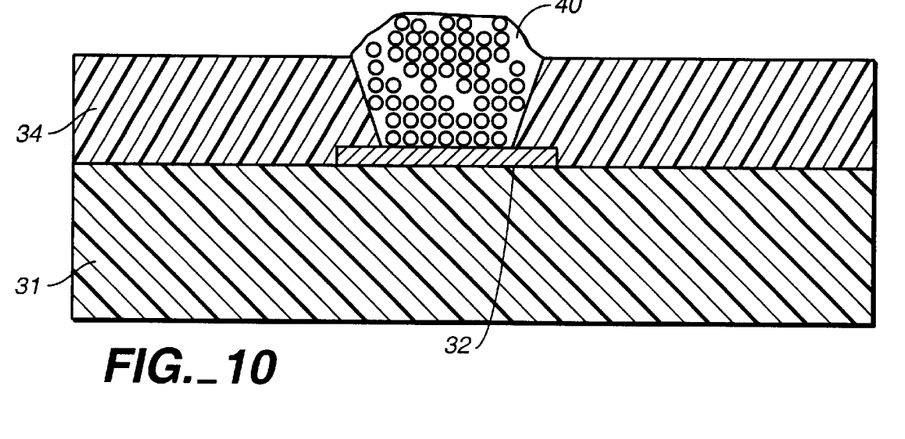

After the solvent in the microencapsulating composition 40 vaporizes, a plurality of microencapsulated conductive particles remain in the dielectric layer 34 aperture. Each microencapsulated particle includes a conductive particle coated with a material comprising a substantially solvent-free carrier material.

Figure 11:
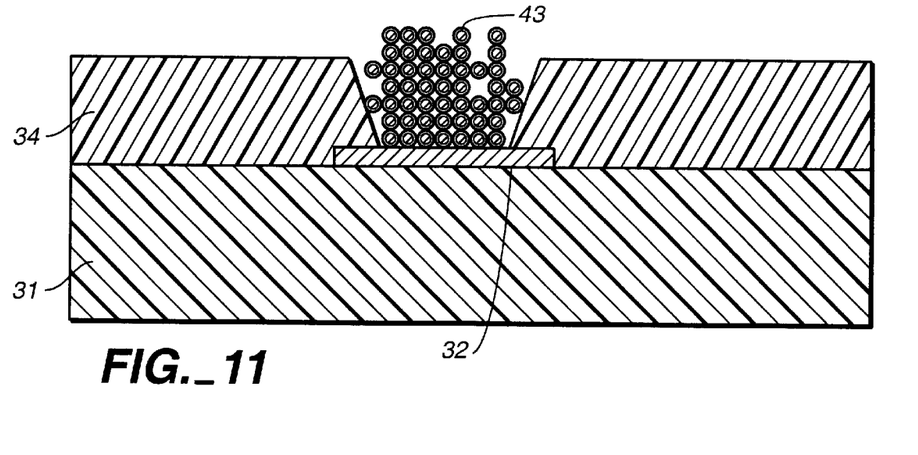

As shown in FIG. 11, the plurality of microencapsulated conductive particles 43 can be disposed on the first conductive region 32 and within the aperture of the dielectric layer 34. The plurality of microencapsulated conductive particles 43 can include a number of interstices between adjacent microencapsulated conductive particles.

Figure 12:
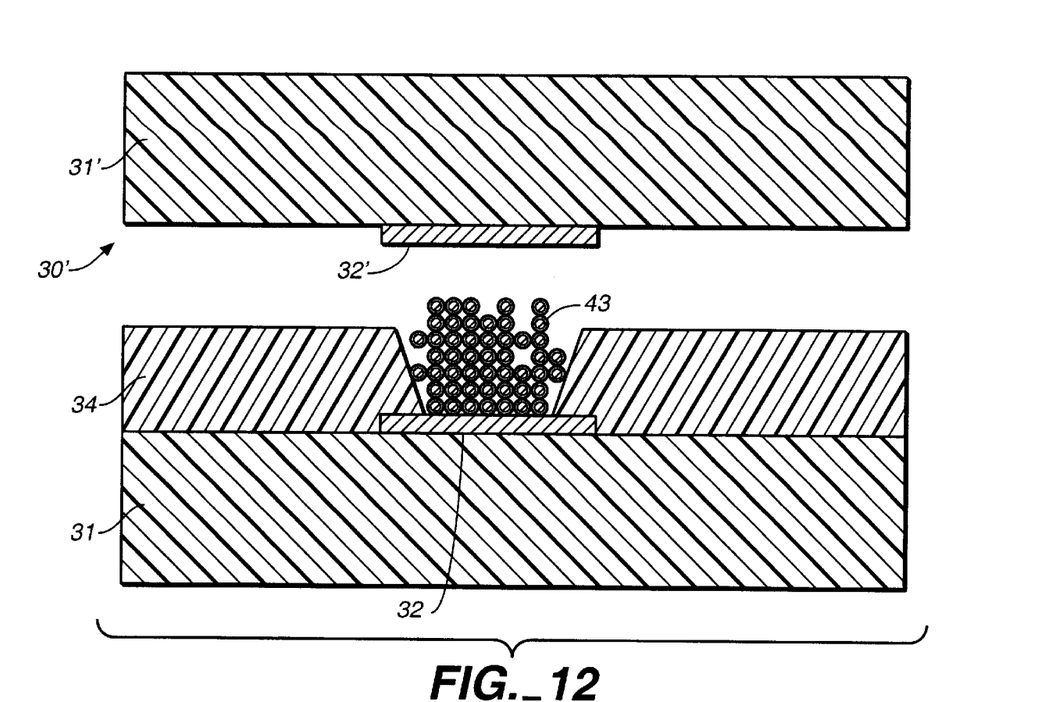

After the plurality of microencapsulated conductive particles 43 are formed and are disposed in the aperture of the dielectric layer 34, a second circuitized layer 30' can be laminated to the bonding sheet 34 so that a second conductive pad 32' on the dielectric layer 31' confronts the first conductive pad 32 and contacts the plurality of microencapsulated conductive particles 43. During the lamination process, heat and pressure can be applied to the combination of the first circuitized layer 30, the dielectric layer 34, and the second circuitized layer 30' to form a multilayer printed circuit substrate 50 such as the one shown in FIG. 13. The heat and pressure can be applied with heated platens (not shown) on the outer surfaces of the first and second circuitized layers 30, 30'. While any suitable laminating apparatus can be used, a vacuum press such as a Wabash VS75H-24 hydraulic vacuum press is preferred. Preferably, the lamination process is performed under vacuum.

Figure 13:
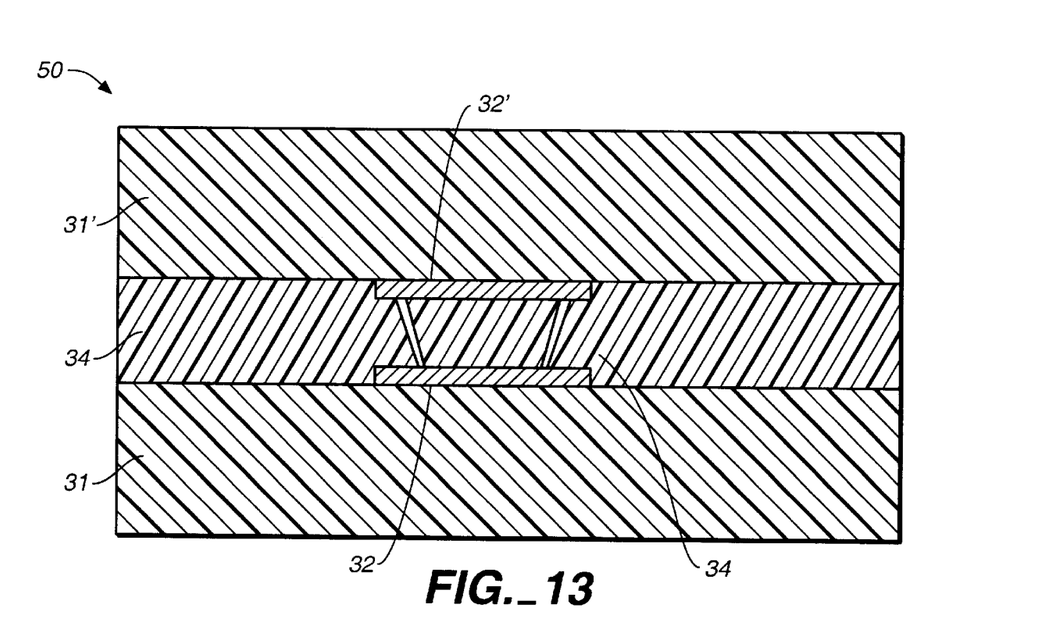

In lamination processing, the applied heat causes the conductive particles to melt and coalesce together. Prior to or during this melting, the fluxing agent in the carrier removes oxides from the conductive particles, thus enhancing their ability to bond and electrically connect to the conductive regions and to the other conductive particles. The coalescing of the conductive particles displaces the coating material in an outward direction. While this is occurring, the pressure applied by the platens can compress the conductive particles into a mass of conductive particles and can further force some of the coating material in a generally radially outward direction. As a result, the displaced coating material can be somewhat separated from the resulting mass of coalescing conductive particles. The displaced coating material can form a generally cylindrically-shaped body of material surrounding the compressed, columnar mass of conductive particles. When the cylindrically-shaped body of material eventually hardens, the resulting hardened annular structure is disposed around the mass of fused conductive particles thus forming a via structure in a cured state. The cured annular structure can have less than about 10 wt. %, preferably less than about 5 wt. %, metallic material, with the balance being the cured components of the carrier.

The respective ends of the body of fused conductive particles in the via structure can bond to respective conductive regions on the first and second circuitized layers through respective bonding regions. The bonding regions can include intermetallic layers created by the diffusion and chemical reaction of atoms between the conductive regions and the mass of fused conductive particles. These bonding regions provide good electrical and mechanical joining between the conductive pads and the melt coalesced conductive particles from the microencapsulating composition. In some embodiments, the areal coverage of the bonding regions can constitute greater than about 75%, and preferably greater than about 95% of the area of a corresponding pad exposed through the dielectric layer on the corresponding pad.

If the dielectric layer 34 is comprised of a thermosetting material, using a plurality of microencapsulated conductive particles to form a multilayer circuit substrate results in a more reliable substrate. Pressure applied by, for example, a lamination press to a conductive slurry disposed within the aperture of a dielectric layer can, in some instances, cause the liquid carrier and the melting metal particles of the slurry to be squeezed in a radially outward direction from the aperture. The heat from the lamination press softens the aperture walls and the pressure applied to the aperture reduces the size of the aperture and can force the liquid carrier and the melting conductive particles into the dielectric layer. The conductive material which extends into the middle of the dielectric layer may resemble conductive tongues in a cross-section of the dielectric layer.

In the plurality of microencapsulated particles, the substantially solvent-free carrier is in the form of a coating on the conductive particles, rather than in the form of a suspension medium. Accordingly, the non-conductive components of the conductive composition in the dielectric layer aperture are minimized, while still providing the desired fluxing agent at the surface of the conducting particles. When pressure is applied to the microencapsulated conductive particles in the dielectric layer aperture, much of the melting conductive particles and the flowing coating material fills the interstices previously present between the microencapsulated particles. The interstices provide a space for the flowing conductive material and coating material to flow so that the likelihood that they pass into the middle of the dielectric layer is substantially reduced. As a result, the likelihood of forming conductive tongues in the dielectric layer is reduced, thus reducing the likelihood of a short circuit in the multilayer printed circuit substrate.

Figure 15:
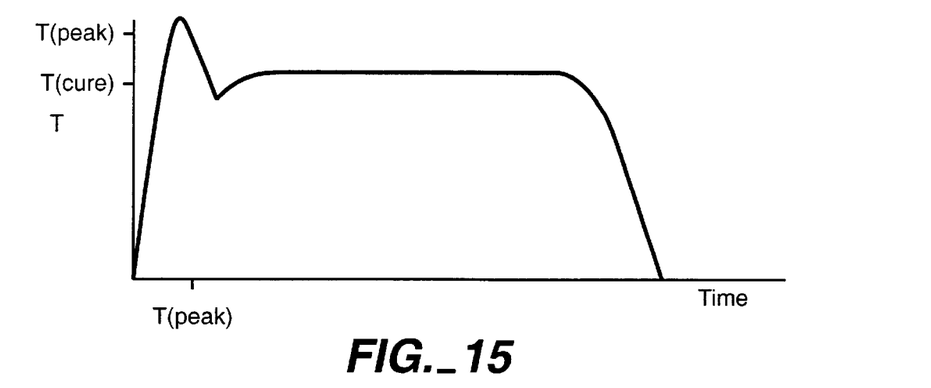
FIG. 15 shows a time vs. temperature graph according to a lamination process using a conductive slurry.
Figure 16:
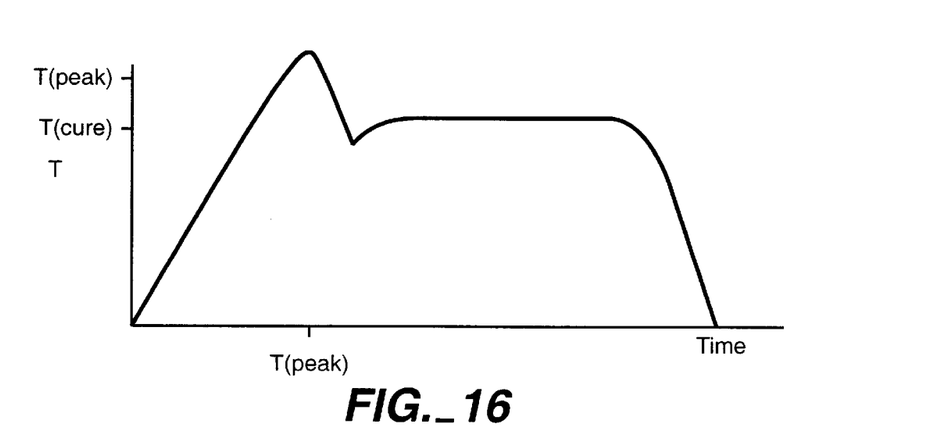
FIG. 16 shows a time vs. temperature graph according to a lamination process using microencapsulated conductive particles.
Figure 17:
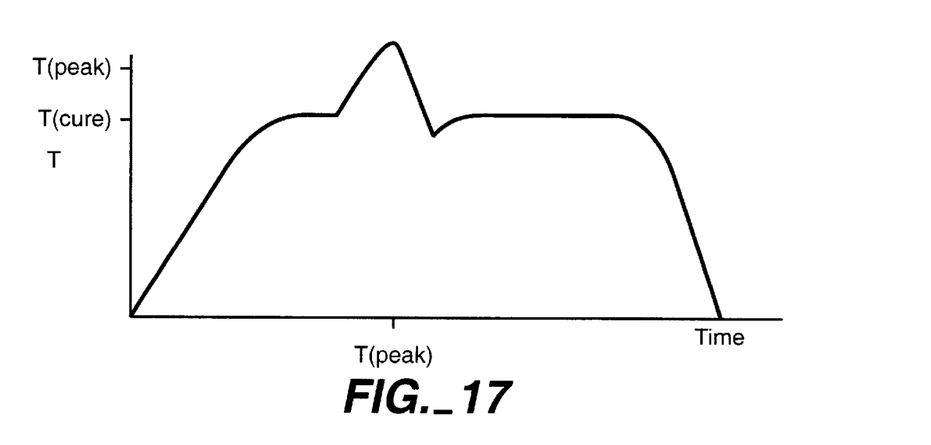
FIG. 17 shows a time vs. temperature graph according to a lamination process using microencapsulated particles.

Another advantage of using microencapsulated particles can be described with reference to FIGS. 15, 16, and 17. FIG. 15 shows temperature-time profile for a lamination process disclosed in U.S. patent application Ser. No. 09/192,003 (filed Nov. 13, 1998) using a conductive slurry disclosed in U.S. patent application Ser. No. 09/203,126 (filed Dec. 1, 1998), as a via structure-forming material. Both of these patent applications are incorporated by reference in their entirety for all purposes and are assigned to the same assignee as the present application. FIGS. 16 and 17 show a temperature-time profile for a lamination process using microencapsulated particles as a via-structure forming material.

In the lamination process disclosed in U.S. patent application Ser. No. 09/192,003, a thermosetting bonding sheet is used, and the process temperature is ramped up to, or above, a peak temperature (e.g., T(peak) in FIG. 15) within the first eight minutes of the lamination process. This period of time can correspond to t(peak) shown in FIG. 15. The peak temperature can be about 5° C. to about 20° C. above the average melting point of the conductive particles forming the via structure. Then, the temperature is ramped down over the next 5 minutes or so to a lower temperature (e.g., T(cure) in FIG. 15) which is suitable for curing the bonding sheet. After the bonding sheet is cured, the lamination apparatus is cooled and the formed multilayer printed circuit substrate is removed from the lamination apparatus.

Advantageously, in embodiments of the second inventive concept, the ramp-up time to the peak temperature can be increased. More specifically, the process temperature can be ramped to, or above, the peak temperature (e.g., T(peak) in FIGS. 16 and 17) during the first 30 or 40 minutes of the lamination process without prematurely curing the coating material on the microencapsulated conductive particles. This period of time can correspond to t(peak) as shown in FIGS. 16 and 17. In embodiments of the second inventive concept, the temperature can be increased to the peak temperature at a rate of about 10° C./minute or less, and preferably between about 6 and about 8° C./minute or less.

Comparing the time-temperature profiles in FIG. 15, and FIGS. 16 and 17, it is apparent that the temperature ramp to the peak temperature is more gradual when using microencapsulated particles made according to the second inventive concept. By slowly ramping the lamination temperature to the peak temperature, the conductive particles can gradually melt and form a cohesive conductive body and the bonding sheet can slowly cure. The gradual hardening aperture walls in the curing bonding sheet prevents the melting conducting particles from passing into the middle of the bonding sheet thus reducing tongue formation. As explained previously, the formation of conductive tongues may undesirably cause a short circuit within a dielectric layer.

The aperture walls can be even more effectively hardened when using a temperature profile as shown in FIG. 17. FIG. 17 shows a temperature profile where the process temperature is slowly ramped up to a temperature which is at or above the curing temperature of the bonding sheet, but is below the reflow or melting temperature of the conductive particles in the aperture. Then, the lamination temperature is held at or above the curing temperature of the bonding sheet for a period of time. Typically, this period of time can be for a time greater than about 5 minutes, preferably between about 5 and about 30 minutes. During this time, the bonding sheet cures and the aperture walls harden. Then, the lamination temperature is ramped up to the peak temperature T(peak) to reflow the microencapsulated conductive particles. After forming the via structures and the multilayer printed circuit substrate, the temperature is then ramped down to room temperature. Holding the temperature at or above near the curing temperature of the bonding sheet, but below the reflow temperature for a period of time prior to reflowing the microencapsulated conductive particles further ensures that the aperture walls of the bonding sheet will harden, thus preventing conductive material from passing into the middle of the bonding sheet.

The via structures according to embodiments of the second inventive concept can have favorable physical and electrical properties. For example, the via structures can have resistances of less than about 20, 10, 5, and even 2 milli-ohms when the via structures have an average height between about 10 to about 100 microns, and an average diameter between about 50 to about 250 microns. In addition, the regions of the multilayer circuit substrates proximate the via structures are free of, or substantially free of blistering. Moreover, in embodiments of the invention, peel strengths of greater than about 1.0 kg/cm can be obtained.

The resulting multilayer circuit substrates perform favorably even when subjected to humid conditions and high thermal cycling. For example, test substrates with daisy chain patterns similar to ones described with respect to the first inventive concept were made. However, the via structures in these test substrates were formed with Sn/SSb solder instead of Au/20Sn solder. The test substrates were tested under the conditions mentioned in Table 1 above. The test substrates with plain copper pads passed all reliability tests, except the thermal cycling and thermal aging tests. The failure of these tests was attributed to the formation of severe Cu—Sn intermetallic growth which appeared to cause cracking. The use of an electroless Ni diffusion barrier and a gold protective layer on the copper pads eliminated the severe intermetallic growth. Test substrates using such Ni/Au layers with via structures made from Sn/5Sb solder passed all of the tests in Table 1.

Furthermore, as described above in the first inventive concept, embodiments of the methods according to the second inventive concept can also provide a multilayer printed circuit substrate with a via structure density between circuitized layers exceeding via structure densities within the circuitized layers. Advantageously, in embodiments of the first inventive concept, there are no large drilled through-holes within the bonding sheet layer to block internal electrical routings which can adversely affect circuit design.

The following Examples illustrate embodiments according to the second inventive concept, and are intended to be illustrative and not limiting.

EXAMPLE 1(a)

A slurry was formed by mixing 13 grams of 95Sn—5Sb solder powder having a diameter less than about 25 μm, 0.444 grams of Heloxy® 505, 0.066 grams of MTHPA (Landau Lindride 12), 0.088 grams of cinnamic acid, and 0.600 grams of mesitylene solvent together. The cinnamic acid was first dissolved at a temperature between about 130° C. and 150° C. in the Heloxy® 505, and was then cooled. As the mixture cooled, MTHPA was stirred in. Mesitylene was then added to the cooled mixture. This mixture was then added to the solder powder to form a slurry. The slurry was stenciled into apertures in a dielectric layer 50 μm thick, and onto conductive pads at the bottom of the apertures. Each of the apertures had a diameter of about 180 μm and a height of about 50 μm. The slurry was heated within the apertures for about 15 minutes at about 80° C. to remove the solvent, and to form microencapsulated 95Sn—5Sb particles. The thickness of the coating on the particles was about 1.5 microns, and constituted about 20 volume percent of each microencapsulated particle.

A circuitized layer was laminated to the dielectric layer so that conductive pads on the circuitized layer were disposed over the microencapsulated particles in the apertures. The resulting structure was heated and pressed in a lamination press. The temperature of the press was ramped up to 260° C. within 30 minutes, ramped down to 180° C. for five minutes, and then was held at 180° C. for 1 hour. The solder in the apertures melted and coalesced into substantially 50 micron-high, generally cylindrically-shaped solder via structures having diameters of 180 microns. Ends of the via structures were bonded to respective conductive pads providing electrical communication between confronting pads. The electrical resistance of the formed via structures was observed to be about 1.4 milli-ohm (with a standard deviation of 0.1 milli-ohm). Over 17,000 via structures were formed. 100% yield was observed.

EXAMPLE 1(b)

The process described in Example 1(a) was repeated, but the microencapsulating composition was deposited into 140 micron apertures in a dielectric layer 50 microns thick. The formed via structures had a resistance of about 2.1 milli-ohm (with a standard deviation of about 0.2 milli-ohm). Over 17,000 via structures were formed. 100% yield was observed.

EXAMPLE 1(c)

The process described in Example 1(a) was repeated, but the solder particles had a size of 15 microns or less, and the thickness of the coating on the conductive particles was about 1 micron. The electrical resistance of the formed via structures was observed to be about 1.4 milli-ohm (with a standard deviation of 0.1 milli-ohm). Over 17,000 via structures were formed. 100% yield was observed.

EXAMPLE 2(a)

A slurry was formed in the same manner as the slurry described in Example 1(a), but di(polypropylene glycol) methyletheracetate was used as a solvent instead of mesitylene.

The solder in the apertures melted and coalesced into substantially 50 micron-high, generally cylindrically-shaped solder via structures having diameters of 180 microns. The electrical resistance of the formed via structures was observed to be about 1.4 milli-ohm (with a standard deviation of 0.1 milli-ohm). Over 17,000 via structures were formed. 100% yield was observed.

EXAMPLE 2(b)

The process in Example 2(a) was repeated, but the microencapsulating composition was deposited into 140 micron apertures in a dielectric layer 50 microns thick. The formed structures had a resistance of about 2.1 milli-ohm (with a standard deviation of about 0.2 milli-ohm). Over 17,000 via structures were formed. 100% yield was observed.

EXAMPLE 3(a)

The process in Example 1(a) was repeated, except that Sn—3.5Ag solder particles (m.p. 221° C., lamination soldering temperature about 230° C. to about 260° C.) were used instead of the 95Sn—5Sb solder particles.

The solder in the apertures melted and coalesced into substantially 50 micron-high, generally cylindricaly-shaped solder via structures having diameters of 180 microns. The electrical resistance of the formed solder via structures was observed to be about 1.4 milli-ohm (with a standard deviation of 0.1 milli-ohm). Over 17,000 via structures were formed. 100% yield was observed.

EXAMPLE 3(b)

The process in Example 1(a) was repeated, except that Sn—3.5Ag solder particles (m.p. 221° C., lamination soldering temperature about 230° C. to about 260° C.) were used instead of the 95Sn—5Sb solder particles. The formed via structures, 140 microns in diameter and 50 microns high) had a resistance of about 2.1 milli-ohm (with a standard deviation of about 0.2 milli-ohm). Over 17,000 via structures were formed. 100% yield was observed in both instances .

EXAMPLE 3(c)

The process in Example 2(a) was repeated, except that Sn—3.5Ag solder particles (m.p. 221° C., lamination soldering temperature about 230° C. to about 260° C.) were used instead of the 95Sn—5Sb solder particles. The electrical resistance of the via structures (50 microns high and 180 microns in diameter) was observed to be about 1.4 milli-ohm (with a standard deviation of 0.1 milli-ohm). Over 17,000 via structures were formed. 100% yield was observed.

EXAMPLE 3(d)

The process in Example 2(b) was repeated, except that Sn—3.5Ag solder particles (m.p. 221° C., lamination soldering temperature about 230° C. to about 260° C.) were used instead of the 95Sn—5Sb solder particles. The formed 50 micron high via structures had a resistance of about 2.1 milli-ohm (with a standard deviation of about 0.2 milli-ohm) for the 140 micron via structures. Over 17,000 via structures were formed. 100% yield was observed.

EXAMPLE 4

A slurry was formed in the same manner as the slurry described in Example 1(a), but 63Sn—37Pb solder particles were used instead of the 95Sn—5Sb solder particles. Further, in this example, the lamination step included a 3 minute ramp to 210° C. and a four minute ramp to 170° C., and then pressure was maintained on the circuit substrate at this temperature for about one hour. The 63Sn—37Pb solder particles were deposited in over 17,000 apertures having a diameter of 180 $\mu$m and over 17,000 apertures having a diameter of 70 $\mu$m in a dielectric layer 50 gm thick. The electrical resistance of the formed solder via structures between the pads was observed to be about 2.0 milli-ohm (with a standard deviation of 0.1 milli-ohm) for the 180 micron via structures, and 3.5 milli-ohm (with a standard deviation of about 0.1 milli-ohm) for the 70 micron via structures. 100% yield was observed in both instances.

EXAMPLE 5

A slurry was formed in the same manner as the slurry described in Example 1(a), except that 80Au—20Sn solder particles were used instead of the 95Sn—5Sb solder particles. Further, in this example, the lamination step included a 5 minute ramp to 297° C. and a thirty minute ramp to room temperature. The 80Au—20Sn solder particles were deposited in over 17,000 apertures having a diameter of 180 $\mu$m and over 17,000 apertures having a diameter of 70 $\mu$m in a dielectric layer 50 $\mu$m thick. The electrical resistance of the formed solder via structures between the pads was observed to be about 2.7 milli-ohm (with a standard deviation of 0.1 milli-ohm) for the 180 micron via structures. 100% yield was observed.

COMPARATIVE EXAMPLE 1

The process described in Examples 1(a) and 1(b) were repeated, but the microencapsulating composition included tetraglyme as a solvent instead of mesitylene. Premature solidification of the carrier appeared to inhibit the coalescing of the conductive particles so that via structures having high resistance and some opens formed.

Any aspect or embodiment of the first inventive concept can be used separately or together with any aspect or embodiment of the second inventive concept in any suitable manner. While the inventions have been particularly described with respect to particularly illustrated embodiments, it will be appreciated that various alterations, modifications and adaptations may be made based on the present disclosure, and are intended to be within the scope of the present inventions.

What is claimed is:

1. A method for forming a multilayer printed circuit substrate comprising:

forming a laminate comprising a first circuitized layer having a first conductive region, a bonding sheet, and a release layer, wherein the bonding sheet is disposed between the first circuitized layer and the release layer;

forming an aperture in the bonding sheet and the release layer to expose the first conductive region;

depositing a conductive composition within the aperture;

reflowing the conductive composition while the conductive composition is within the aperture to form a conductive bump;

separating the release layer from the bonding sheet; and laminating a second circuitized layer having a second conductive region to the first circuitized layer so that the conductive region of the second circuitized layer is electrically coupled to the conductive bump.

2. The method of claim 1 wherein forming an aperture comprises laser drilling the bonding sheet and the release layer to expose the first conductive region.

3. The method of claim 1 wherein forming the laminate comprises laminating the bonding sheet and the release layer to the first circuitized layer.

4. The method of claim 1 wherein forming the laminate comprises laminating a composite having a first release layer and a bonding sheet to the first circuitized layer so that the first release layer is on top of the bonding sheet;

peeling off the first release layer to expose a surface of the bonding sheet; and then laminating a second release layer to the exposed surface of the bonding sheet to form the laminate.

5. The method of claim 1 wherein the aperture includes a diameter between about 25 and about 500 microns.

6. The method of claim 1 wherein separating the release layer from the bonding sheet comprises peeling the release layer off of the bonding sheet.

7. The method of claim 1 further comprising forming a bonding region having an intermetallic bond, the bonding region being disposed between the conductive bump and the second conductive region of the second circuitized layer.

8. The method of claim 1 wherein the second conductive region comprises a conductive pad.

9. The method of claim 1 wherein after forming an aperture, the method further comprises cleaning the aperture.

10. The method of claim 1 wherein depositing a conductive composition comprises squeegeeing the conductive composition across a top surface of the release layer and into the aperture.

11. The method of claim 1 wherein the bonding sheet comprises a thermoplastic resin.

12. The method of claim 1 wherein the conductive composition comprises solder.

13. A bumped circuit structure comprising:

a first circuitized layer having a first conductive region, a bonding sheet on the first circuitized layer, and a release layer on the bonding sheet, wherein the bonding sheet and the release layer have a common aperture disposed over the first conductive region, and wherein the common aperture includes a conductive bump.

14. The bumped circuit structure of claim 13 wherein the bonding sheet is thermoplastic.

15. The bumped circuit structure of claim 13 wherein the conductive bump extends above an upper surface of the bonding sheet.

16. The bumped circuit structure of claim 13 wherein the bump includes solder.

17. The bumped circuit structure of claim 13 wherein the release layer comprises polyimide.

18. A multilayer printed circuit substrate made by the process of claim 1.

19. A multichip module comprising:
the multilayer printed circuit substrate of claim 18; and
one or more chips disposed on the multilayer printed circuit substrate.

20. is microencapsulated particle comprising:
a conductive particle having a melting point less than about 400° C.;
and a coating on the conductive particle, the coating comprising (i) an epoxy-functional resin having a viscosity of less than about 1000 centipoise at 25° C., or derivative thereof, and (ii) a fluxing agent or a fluxing agent derivative.

21. The microencapsulated conductive particle of claim 20 wherein the epoxy-functional resin is a castor oil derivative.

22. The microencapsulated conductive particle of claim 20 wherein the epoxy-functional resin comprises a weight per epoxide greater than about 500.

23. The microencapsulated conductive particle of claim 20 wherein the coating has a substantially uniform thickness and has a thickness of about 5 microns or less.

24. The microencapsulated conductive particle of claim 20 wherein the coating further comprises a hardener.

25. The microencapsulated conductive particle of claim 20 wherein the conductive particle comprises solder.

26. A microencapsulating composition made by the process comprising:
mixing a carrier and a plurality of conductive particles having a melting point less than about 400° C. together, wherein the carrier comprises an epoxy-functional resin having a viscosity of less than about 1000 centipoise at 25° C., a solvent which is substantially non-reactive with the epoxy-functional resin, and a fluxing agent.

27. The microencapsulating composition of claim 26 wherein the solvent is a non-polar solvent.

28. The microencapsulating composition of claim 26 wherein the composition further comprises a hardener.

29. The microencapsulating composition of claim 26 wherein the resin comprises an epoxy functionality between about 550 to about 660.

30. The microencapsulating composition of claim 26 wherein the resin is a derivative of castor oil.

31. The microencapsulating composition of claim 26 wherein the resin is in an amount of at least about 20% by weight of the carrier, the fluxing agent is in an amount of at least about 1% percent by weight of the carrier, and the solvent is in an amount of about 40% to about 60% by weight of the carrier.

32. The microencapsulating composition of claim 26 wherein the conductive particles comprise solder.

33. A method of making a plurality of microencapsulated conductive particles, the method comprising:
mixing a carrier and a plurality of conductive particles having a melting point less than about 400° C. together to form a slurry, wherein the carrier comprises a mixture of an epoxy-functional resin having a viscosity of less than about 1000 centipoise at 25° C., a solvent which is substantially non-reactive with the epoxy-functional resin, and a fluxing agent; and
heating the slurry to vaporize the solvent and to form a plurality of microencapsulated conductive particles.

34. A method for forming a multilayer printed circuit substrate comprising:
mixing a carrier and a plurality of conductive particles having a melting point less than about 400° C. together to form a slurry, wherein the carrier comprises a mixture of an epoxy-functional resin having a viscosity of less than about 1000 centipoise at 25° C., a solvent which is substantially non-reactive with the epoxy-functional resin, and a fluxing agent;
depositing the slurry on a first conductive region disposed at a first end of an aperture in a dielectric layer;
heating the slurry to vaporize the solvent and to form a plurality of microencapsulated conductive particles within the dielectric layer aperture;
contacting the plurality of microencapsulated particles with a second conductive region at a second end of the aperture; and
applying pressure and heat to the plurality of microencapsulated particles to form a via structure which electrically communicates the first and second conductive regions.

35. The method of claim 34 wherein the solvent is nonpolar.

36. The method of claim 34 wherein the dielectric layer is thermosetting.

37. The method of claim 34 wherein the particles comprise solder.

38. The method of claim 34 wherein applying pressure and heat includes applying pressure and heat under vacuum.

39. The method of claim 34 wherein applying pressure and heat comprises applying pressure and heat with a lamination press.

40. The method of claim 34 wherein applying pressure and heat comprises heating the microencapsulated particles to a temperature at or above the peak temperature of the conductive particles.

41. The method of claim 40 wherein heating the microencapsulated particles to a temperature at or above the peak temperature of the conductive particles comprises heating at a rate of about 10° C. per minute or less.

42. A multilayer printed circuit substrate made by the process according to claim 34.

43. A multichip module comprising:
the multilayer printed circuit substrate of claim 42; and
a plurality of chips disposed on the multilayer printed circuit substrate.

44. A multilayer circuit substrate comprising:
a first circuitized layer having a plurality of drilled apertures and via structures disposed in the drilled apertures;
a second circuitized layer having a plurality of drilled apertures and via structures disposed in the apertures;
and a bonding sheet having a plurality of via structures disposed between the first and second circuitized layers, wherein a density of the via structures in the bonding sheet is greater than a density of via structures in each of the first circuitized layer and the second circuitized layer.

* * * * *